United States Patent
Caldwell et al.

(10) Patent No.: US 6,441,606 B1
(45) Date of Patent: Aug. 27, 2002

(54) DUAL ZONE WAFER TEST APPARATUS

(75) Inventors: John Caldwell, Meridian; James Nuxoll; Robert Totorica, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 09/690,564

(22) Filed: Oct. 17, 2000

(51) Int. Cl.⁷ ............................................. G01R 31/02
(52) U.S. Cl. ..................... 324/158.1; 324/760; 324/765
(58) Field of Search ................................. 324/754, 761, 324/765, 158.1, 760; 438/14, 17, 18; 257/48; 165/80.2, 80.5

(56) References Cited

U.S. PATENT DOCUMENTS

| | | | |
|---|---|---|---|
| 5,325,052 A | * | 6/1994 | Yamashita ................. 324/760 |
| 5,407,350 A | | 4/1995 | Iwabuchi et al. |
| 5,510,724 A | | 4/1996 | Itoyama et al. |
| 5,557,215 A | * | 9/1996 | Saeki et al. ................. 324/765 |
| 5,568,054 A | | 10/1996 | Iino et al. |
| 5,570,032 A | | 10/1996 | Atkins et al. |
| 5,843,844 A | | 12/1998 | Miyanaga |
| 5,883,522 A | | 3/1999 | O'Boyle |
| 5,982,183 A | | 11/1999 | Sano |
| 6,037,794 A | | 3/2000 | Yamamoto et al. |
| 6,064,213 A | | 5/2000 | Khandros et al. |
| 6,078,845 A | | 6/2000 | Friedman |
| 6,082,950 A | | 7/2000 | Altwood et al. |
| 6,084,215 A | | 7/2000 | Furuya et al. |
| 6,087,845 A | | 7/2000 | Wood et al. |
| 6,094,059 A | | 7/2000 | Frankeny et al. |
| 6,124,725 A | * | 9/2000 | Sato ........................... 324/765 |

* cited by examiner

*Primary Examiner*—Vinh P. Nguyen
(74) *Attorney, Agent, or Firm*—Killworth, Gottman, Hagan & Schaeff LLP

(57) ABSTRACT

A wafer cassette includes a stationary dual-zone temperature control base and a removable wafer cassette top. The top includes a main cassette support structure, onto which wafer test electronics, a test interface connector, a wafer interconnect assembly, a wafer test area, a flex film interconnect, and a wafer chuck with evacuation chamber and electric wafer heater, and at least one rough alignment fixture are mounted. A wafer to be tested is inserted, with a pressure-isolating seal, between the wafer chuck and the wafer test area. The base is a stationary fixed portion which includes a first support compartment, a second support compartment and thermal circuits, each of which includes fluid inlet and outlet connections. The fixed portion further includes a heater interconnect to provide connection and external access for a heater element, as well as a vacuum interconnect line to provide external connection to the evacuation chamber. The first and second support compartments are adjacently spaced, and each contains at least one of each of the thermal circuits.

38 Claims, 6 Drawing Sheets

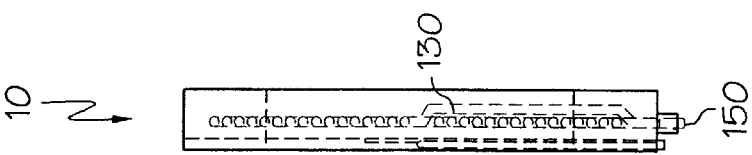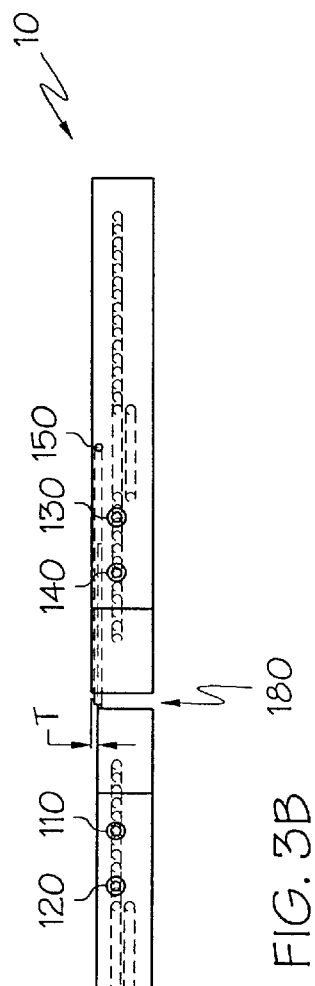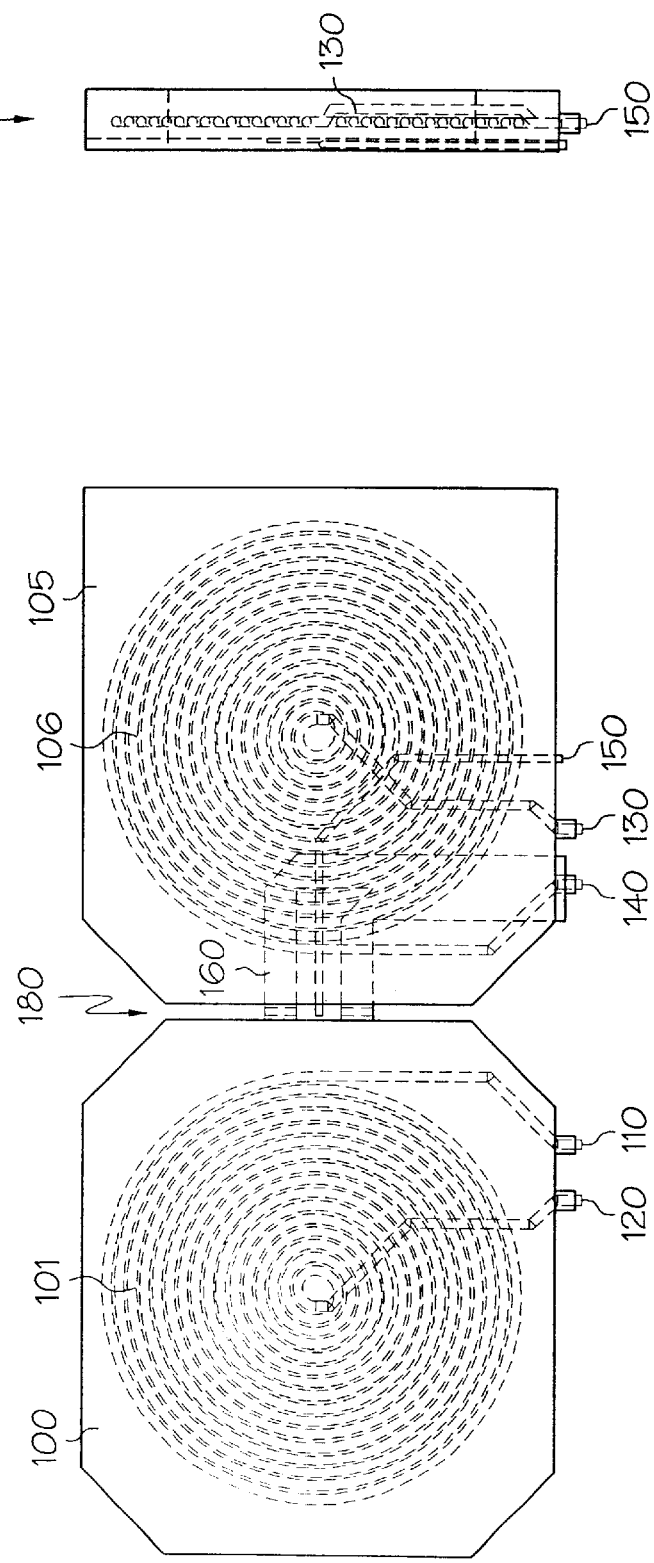

DUAL ZONE WAFER TEST APPARATUS

BACKGROUND OF THE INVENTION

The present invention relates generally to an apparatus for testing semiconductor devices, and more particularly to an apparatus providing dual temperature zone dynamic wafer-level burn-in of semiconductor devices.

Testing of semiconductor devices during the numerous steps involved in their fabrication occurs at various points along the process to determine proper circuit operability. Two of the more prevalent places to conduct such electrical tests are first at the wafer level, where an integrated circuit (IC) semiconductor device is formed, along with hundreds of others, on a six, eight or twelve inch diameter circular wafer of doped silicon, and second, at the IC level, where individual ICs, known singularly and collectively as "die" and "dice" respectively, are cut from the wafer and tested either in a "bare" or "encapsulated" state prior to shipping. A critical part of the first type of testing (i.e.: wafer level) involves so-called "probe" testing, where connections between each interconnect, or pad, on a device on a wafer and the testing apparatus are temporarily made to provide a communication path through which preprogrammed test signals are passed.

Once the ICs are separated from the wafer, an elevated temperature "burn-in" operation is employed to subject the IC to a further battery of tests, thus providing a better indication that the device will function for its intended purpose. Burn-in testing is used to accelerate the identification and isolation of semiconductor devices prone to infant mortality failure mechanisms. During elevated-temperature burn-in testing, stable, precise control of the test chamber is required to ensure, among other things, that adequate impurity migration (which accounts for a significant portion of device infant mortality) is accounted for. However, burn-in testing can be a significant factor in the cost of processing of semiconductor devices. In an era where customer demands to simultaneously increase semiconductor reliability and reduce prices continues apace, manufacturers have been forced to look to increasingly innovative ways to lower the expense of device manufacture while still providing the high-quality products their customers have come to expect.

Traditional burn-in testing has been at the packaged device level, where the use of specialized burn-in boards and sockets is prevalent. Properly engineered boards and sockets, with their complex interconnection schemes and setup, increases testing time and expense. Thus, wafer level burn-in testing can provide a much quicker, less expensive way to determine if a significant number of ICs on a single wafer are worthy of being diced, individually packaged, and then subjected to more detailed operational tests. Dynamic burn-in testing at the wafer level is one of the ways, along with static and full-functional, or "intelligent" burn-in, to maximize the likelihood that a batch of semiconductor devices will survive in an end-use product, while keeping the costs to a minimum.

However, the emergence of wafer level testing has not alleviated all of the problems of die level testing. Current wafer burn-in approaches have wafers connected to rack or oven mounted control system tester/drive electronics. If a portion of the test electronics experiences a malfunction, the entire oven must be shut down to remove or repair the defective electronic module. Additional down-time can result from routine thermal circuit connections made each time a cassette holding a wafer under test is inserted into a rack or oven. For example, when a single (i.e.: non-removable) fixture with multiple temperature control feed lines is utilized, such an approach is inconvenient and time-consuming from a test standpoint, as each time a wafer needs to be inserted or removed from the test area, the thermal circuits attached to the wafer cassette must be disconnected, as the integral nature of the wafer cassette and housing necessitate removal of both to access and remove the wafer. The potential for damage to the connectors under such an approach is great, especially after repeated use.

Testing systems are used in many of the stages of the semiconductor fabrication process. In some instances, these stages are carried out over numerous individual machines, while in others, within a single integrated apparatus. Inside wafer level burn-in systems are coming to market. In such systems, wafers are supported in a wafer cassette that secures the wafer under test to maintain precise positional control, thus permitting proper alignment between the individual dies on the wafer and the control electronics. Precise temperature control of wafers under test is required to ensure that actual operating conditions to which an individual die will eventually be exposed in service are accurately replicated. Thermal control systems employing water, air and combinations thereof are both under development and coming to market, in order to keep temperatures in the test area stable for just such purposes. Typically, the test housing in these systems contain the support base, wafer and wafer test fixtures, as well as thermal circuitry. The fluid is routed through thermal circuit penetrations in the support structure walls of the test housing, and is used as a heat transfer mechanism for all of the parts within the housing. It must be pointed out that a thermal circuit responsive to the aggregate needs of the entire cassette may not be suitable to the needs of just the wafer being tested.

In addition, the test electronics are located away from the article being tested, with connection to their remote location effected through coupling cables or the like. This remote positioning of the test electronics inhibits the ability of the burn-in test to adequately support the increasingly faster modem electronic circuits, many of which have a clock time of such short duration that the travel time to and from the remote test electronics is greater than the time between clock cycles. Higher inductance and capacitance occurs when signals must pass through long lines to remotely-spaced electronic devices. This leads to less sharp, well-defined signal transitions, which lead to a compromise in signal integrity. However, merely placing the test electronics adjacent the wafer cassette, without consideration of the wildly varying thermal needs of the test electronics, would only serve to exacerbate an already-perplexing thermal management problem for the wafer under test, as well as potentially jeopardizing sensitive electronic devices.

Accordingly, the need exists in the art for a system which can provide inexpensive, compact and reliable support for wafers during burn-in, especially permitting independent temperature regimes to be tailored to the particular testing needs of the wafer and test electronics, while simultaneously facilitating quick insertion and removal of the wafers under test.

SUMMARY OF THE INVENTION

The present invention satisfies the aforementioned need by providing a system which utilizes a separable wafer cassette and base, on-board test electronics, and a plurality of independent temperature control means for the wafer under test and the test electronics. The stackable, modular features of a wafer cassette separable from a stationary base ensure greater system flexibility to meet myriad testing requirements by facilitating wafer interchangeability without having to disconnect and reconnect the thermal circuits each time a wafer is changed. This is made possible in the present invention by including the thermal circuits and their connectors as integral parts of the base, which is in turn fixed to a chassis in the oven or rack. Moreover, the on-board mounting and attendant close proximity of the test electronics to the wafers being tested ensures maximum test performance at rapid test speeds, as well as a compact package, which is critical when such a package is to be enclosed in the tight confines of a burn-in oven.

According to an aspect of the present invention, a wafer burn-in cassette support comprises at least a stationary wafer temperature control base which houses a plurality of substantially adjacent compartments. In the present context, a "compartment" is any structural member that includes at least partial containment of components disposed therein. This would include, for example, any box- or canister-like structure, either with or without an enclosing lid or top. As used here, and throughout the remainder of this disclosure, the term "substantially" to describe a relationship between elements in a device means approximately, but does not have to include an exact, precise or complete relationship. For example, a relatively thin space between the individual compartments could accommodate an insulative medium therebetween, such as air, an inert gas, foam, or other low thermal conductivity material and still be consistent with the instant meaning of substantially adjacent.

This aspect further includes thermal circuits with externally accessible connectors that penetrate the walls of the plurality of compartments of the base, while one of the plurality of compartments includes a vacuum interconnect for securing a wafer to be tested, as well as an electric heater interconnect, both of which include externally accessible connectors. The thermal circuits are designed to operate independently, so that a first thermal circuit could maintain the environment within one of the compartments at one temperature, while a second thermal circuit could maintain a separate, different temperature level in another. Separate, conventional manual or feedback-based thermostatic control means could be employed for each circuit, thus ensuring their autonomy. The "dual zone" approach of the present invention therefore allows the wafer under test to be at one temperature, while the nearby test electronics are maintained at another. The use of multiple zones, plus combining the thermal circuit with an electric wafer heater, allows precise control over the temperature in the compartments, with the thermal circuit providing the rough, coarse control, and the electric wafer heater providing the fine-tuning. This approach alleviates the control system cycling (and related hysteresis) problems associated with having various disparate pieces of equipment in a burn-in oven, which are susceptible to different thermal absorption and radiative response times than those of the thin wafers under test. The system of the present invention provides strict, precise control over the test temperature, thus ensuring a more accurate test of the wafer.

According to another aspect of the present invention, a wafer burn-in cassette comprises, in a stacked, aligned, sandwich-like construction, at least a wafer burn-in board assembly, including a platform, on-board wafer test electronics, an electrical test interface connector between the test electronics and external electrical devices, a wafer interconnect assembly with integral wafer test interconnect probes and temperature probes, a wafer test area with an integral aperture through which contact between the aforementioned probes and the surface of the wafer under test is made, and a wafer chuck, which holds the wafer in a spaced, axially aligned relationship between the vacuum source, the heating and cooling source and the aforementioned wafer test area. A platform, as used herein, is a rigid main support member upon which other components may be stacked or mounted. A platform can be configured generally as a tray or plate, with optional gripping, handling or mounting surfaces. This integrated approach of attaching the test electronics and the wafer under test to a common support member allows for a compact mounting and dismounting arrangement. In addition, the close proximity of the test electronics permits a much more rapid transfer of data between it and the individual devices on the wafer, thus ensuring compatibility with sharper signal transitions and rapid test rates.

In still another aspect of the invention, a combination of alignment features are built into the assembly comprising the wafer burn-in cassette and wafer burn-in cassette base to maximize the potential for proper wafer-to-probe alignment. In the cassette section, rough alignment fixtures present on the respective mating surfaces of the aforementioned wafer test area and wafer chuck ensure properly stacked alignment of the individual elements. The use of vacuum mounting further guarantees that once the wafer is mounted, it will not shift during the test. The precise juxtaposition of the wafer under test and the probes to which the individual pads or contacts on the wafer are to be placed in electrical communication is thus ensured by the combination of the alignment fixtures and the provided vacuum. Other embodiments of the cassette may effect alignment via fiducial or visual means. In the base section, the height in the stackwise direction between the substantially adjacent support compartments is different by an amount substantially equal to the thickness of the aforementioned wafer chuck. Thus, the removable wafer cassette with wafer in a wafer chuck is mounted to the base in such a way as to leave no significant vertical gaps that could adversely effect the cassette-to-base connection.

In yet another aspect of the present invention, the wafer interconnect assembly of the wafer cassette further includes a flex film interconnect that avoids electrical connection malfunctions by providing a generally flat, permanently connected direct signal path via parallel, internal wiring channels embedded in a thin sheet of flexible material (such as polyamide plastic) that extends between the aforementioned probes and the wafer test electronics. The chief advantage of the flex film's thin profile is that it allows these same test electronics to be close to the wafer under test, which permits much more rapid test speeds, and information transfer rates faster than hitherto possible, thereby facilitating data communication from the wafer test interconnect probes located on the wafer interconnect assembly. Thus, a more compact and functional modular burn-in test package is realized.

According to still another aspect of the present invention, the base is designed to be separable from the attached wafer cassette such that upon removal of the cassette, the base, and all of its electrical and thermal connections need not be disconnected, thus minimizing down time and inconvenient delays. As defined herein, the term "connected" is extended to not just include structures that are bolted, screwed, latched, hinged, fastened, glued, nailed and related approaches, but also to those that through a contiguous relationship are confined in their relative movement to one another though a stacked sandwich-like arrangement. An advantage of the system of the present invention is that its two-part construction, with a removable wafer cassette on top of a stationary base designed to be fixed to the chassis of a semiconductor testing system, is that wafers can be inserted or removed with minimal intrusion to the operation of the thermal control portions of the heating and cooling apparatus. Much of this is due to the thermal circuits being mounted to the stationary base rather than the removable wafer cassette such that they need not be removed each time a wafer is changed. An additional benefit to this configuration is that by minimizing the number of times a user must connect or disconnect thermal circuit fittings, the risk of harm to either the user or adjacent sensitive electronic and plumbing equipment is minimized.

These and other objects and advantages of the invention will be apparent from the following description, the accompanying drawings, and the appended claims.

BRIEF DESCRIPTION OF THE DRAWINGS

FIG. 3A is a plan view of the stationary dual-zone temperature control base portion of FIG. 2, highlighting the fluid circulation loops;

FIG. 3B is an elevation view of the stationary dual-zone temperature control base portion of FIG. 2;

FIG. 3C is an elevation view of the stationary dual-zone temperature control base portion of FIG. 2;

DESCRIPTION OF THE PREFERRED EMBODIMENTS

Figure 1:
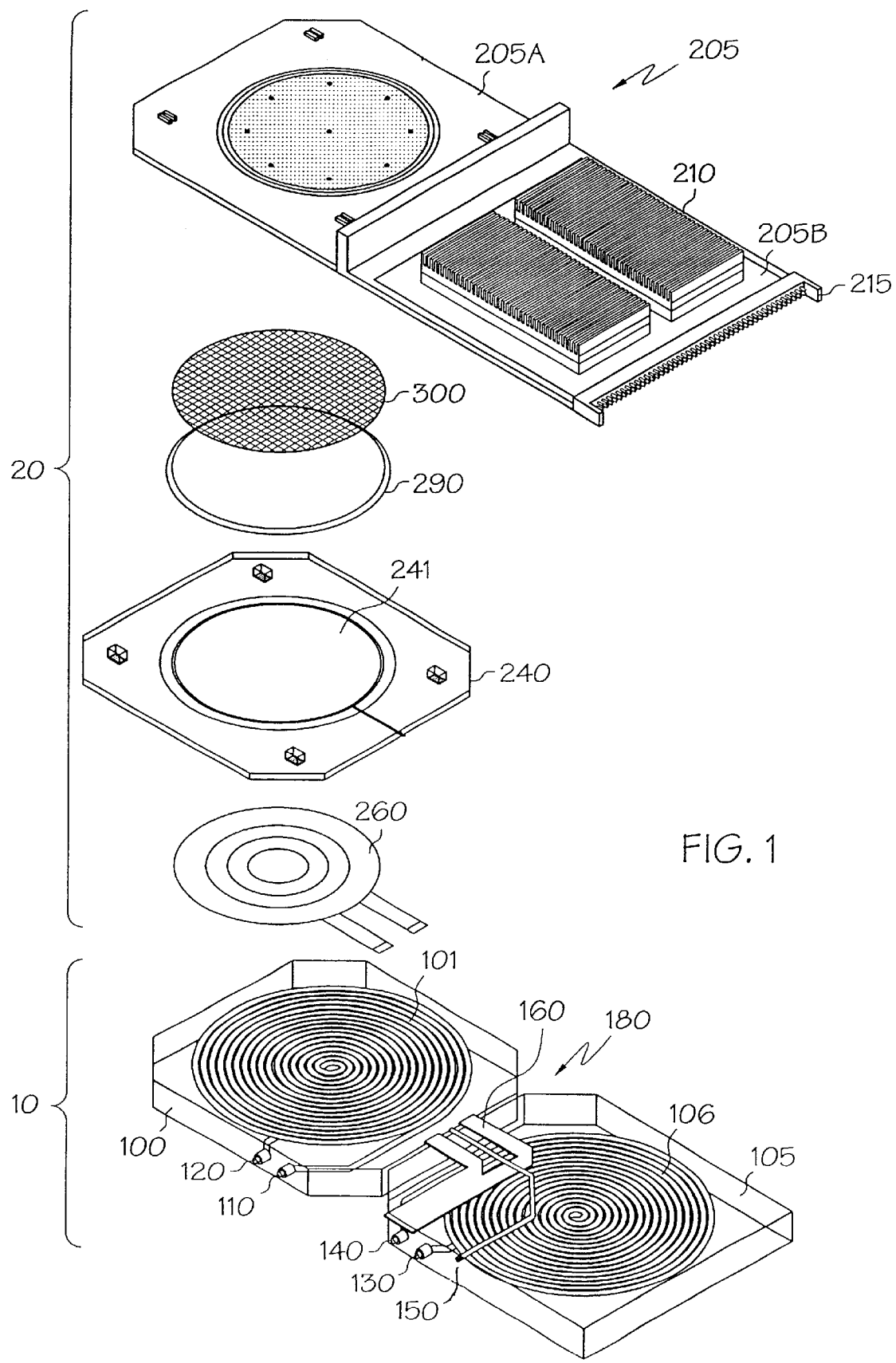
FIG. 1 is an exploded isometric view of a removable wafer cassette portion and its relative position to a stationary dual-zone temperature control base portion.
Figure 2:
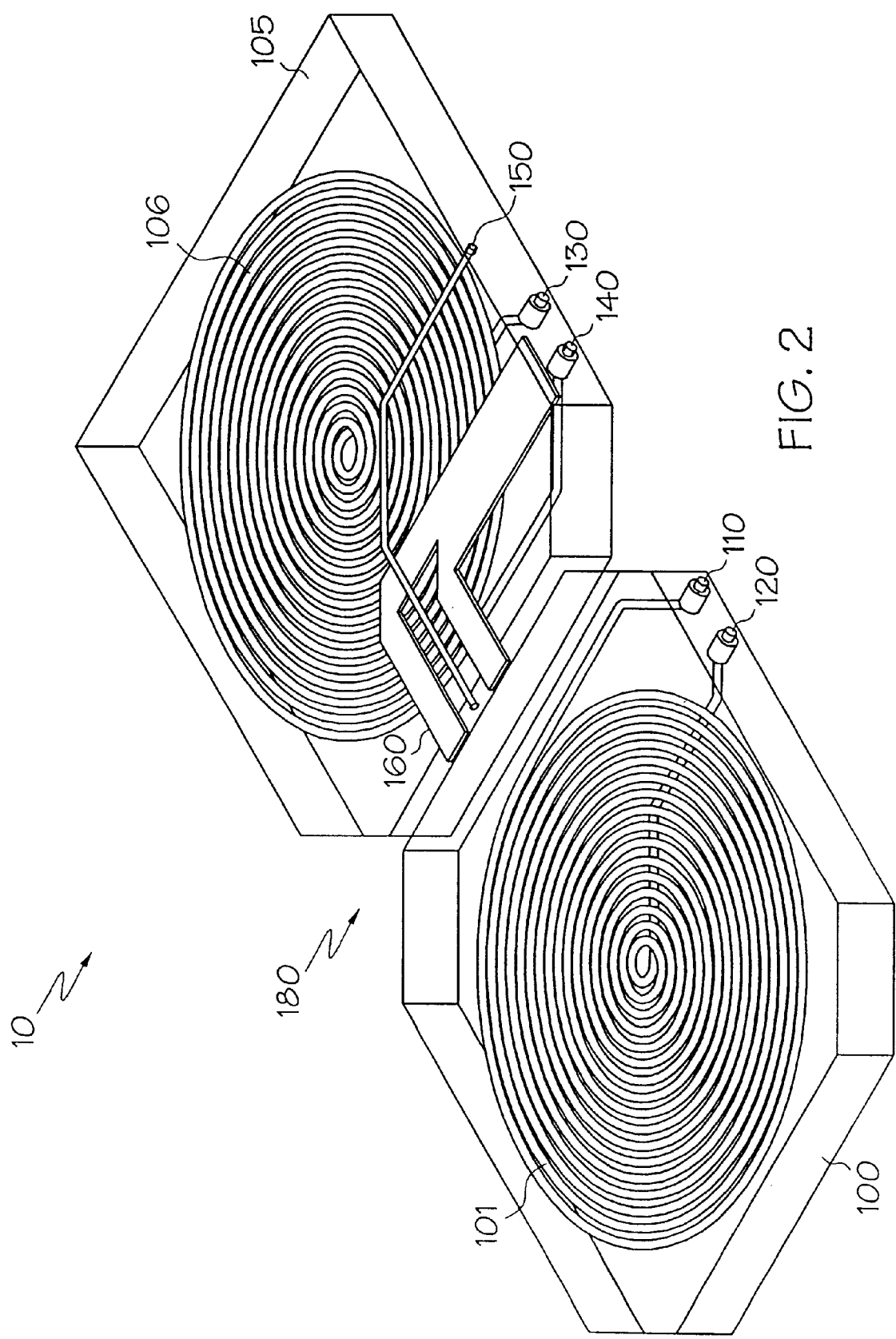
FIG. 2 is an isometric view of the stationary dual-zone temperature control base portion of the present invention.

Referring to FIGS. 1–6, the present invention includes a stationary dual-zone temperature control base portion 10, also referred to as a wafer test base, positioned beneath a removable wafer cassette portion 20. As further shown in FIGS. 1–3, the base portion 10 is made up of two sections that define a first support compartment 100, and a second support compartment 105. The first support compartment 100 and second support compartment 105 are separated by an insulative medium 180 for thermal isolation between the two. Thermal circuits 101 and 106 are disposed in support compartments 100 and 105 respectively. As defined herein, a "thermal circuit" is piping, tubing, ducting, line or other structure designed to carry fluid through a path to enable heating or cooling of one or more elements along such path. Likewise, "thermal control" includes any approach to provide fluid to a thermal circuit at a predetermined temperature. First support compartment 100 has thermal circuit 101 with fluid in and fluid out connections 110, 120 penetrating an upstanding edge thereof, while second support compartment 105 has thermal circuit 106 fluid in and fluid out connections 130, 140 similarly penetrating an upstanding edge. The generally spiral coiled path of the thermal circuit in both compartments ensures thorough, even thermal control of a semiconductor wafer 300 and wafer test electronics 210, respectively. It is noted, however, that other thermal circuit patterns (not shown), such as diagonal, transverse and zig-zag, are possible, depending on shape and configurational requirements of the support compartments and wafer chucks. Second support compartment 105 also includes an externally accessible vacuum interconnect 150 and an externally accessible electric wafer heater interconnect 160, each of which pass through the upstanding portion of the second support compartment 105 and are slightly elevated relative to the top of first support compartment 100 to enable quick interconnection between them and the removable wafer cassette portion 20, which is placed on top of the second support compartment 105.

Figure 4:
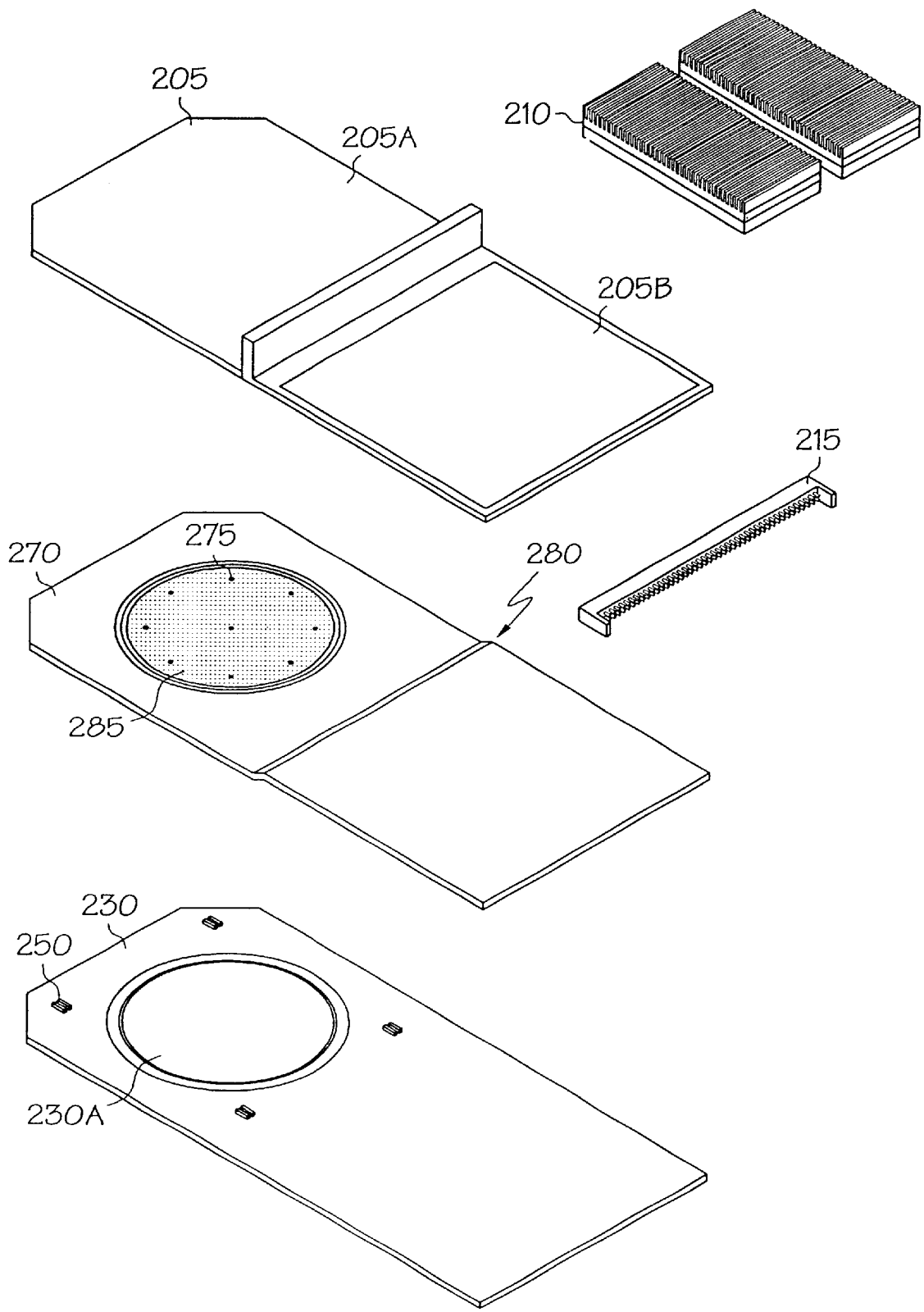
FIG. 4 is an exploded isometric view of the uppermost portion of the wafer cassette of FIG. 1.

The wafer cassette portion 20, shown in FIGS. 1 and 4, is removable from, and stackably arranged to be positioned on top of, the test base 10. As particularly shown in FIG. 1, the semiconductor wafer 300 to be tested is placed on an apertured test platform surface 241 of wafer chuck 240, and circumferentially surrounded by a seal 290, which is typically made of various elastic materials, such as rubber, depending on the temperature regime in which the wafer is tested. Details of the wafer cassette 20, as shown in FIG. 4, include a platform 205, which defines a main cassette support structure. The platform 205 comprises two substantially equal-sized halves 205A, 205B, with the first half 205A defining a cover axially aligned with a wafer interconnect assembly 270, a wafer test area 230, the wafer chuck 240, and the first support compartment 100. Apertured test platform surface 241 is axially aligned in a vertical direction with the cassette 20 and the first support compartment 100. The wafer chuck 240, wafer 300 and seal 290 are attached to the cassette 20 so that the entire assembly can be removed from the base 10 without having to disconnect the vacuum interconnect 150, electric wafer heater interconnect 160, or thermal circuit connections 110, 120, 130 and 140.

The second half 205B defines a portion upon which the wafer test electronics 210 are disposed. The wafer test electronics 210 send and acquire test and driver signals to the wafer 300 during testing. Signals generated during testing can be used to determine if one or more portions on the wafer 300 are defective. Operation of the wafer test electronics 210 results in the generation of significant levels of local heat, therefore the second support compartment 105 and thermal circuit 106 are substantially axially aligned with the wafer test electronics 210 to remove some of this excess heat. A test interface connector 215, designed to interface with external electrical supply and control circuitry, is mounted to the edge of platform 205. The wafer interconnect assembly 270 is connected to the platform 205 via flex film interface 280. The wafer interconnect assembly 270 further includes wafer test interconnect probes 285 and temperature probes 275 disposed on its upper surface. Flex film interconnect 280 establishes electrical communication between wafer test interconnect probes 285, temperature probes 275 and the wafer test electronics 210. The wafer test area 230 is connected to the wafer interconnect assembly 270, and further includes an aperture 230A in the surface. The wafer test area 230 is adjacent the wafer test interconnect probes 285 and temperature probes 275 to facilitate simple, direct contact between the probes and wafer 300. All of the above are vertically stacked and aligned so that the generally circular area defined by the aperture 230A in the wafer test area 230 and the wafer interconnect assembly 270 can accommodate wafer 300.

FIGS. 3A–C show different views of the base section. The heightwise (vertical) dimension of the second support compartment 105, shown in FIG. 3B, is slightly larger than that of the first support compartment 100. This difference, designated T in the figure, is to ensure a smooth surface across the entire top of the base when wafer chuck 240 is placed on top of first support compartment 100. In FIGS. 3A–B, the insulative medium 180 is shown in between adjacent edges of the first and second support compartments 100, 105 to minimize thermal crosstalk between the two. In addition, FIG. 3A shows the integration of vacuum interconnect 150 and electric heater interconnect 160 through second support compartment 105 and above first support compartment 100.

Figure 5:
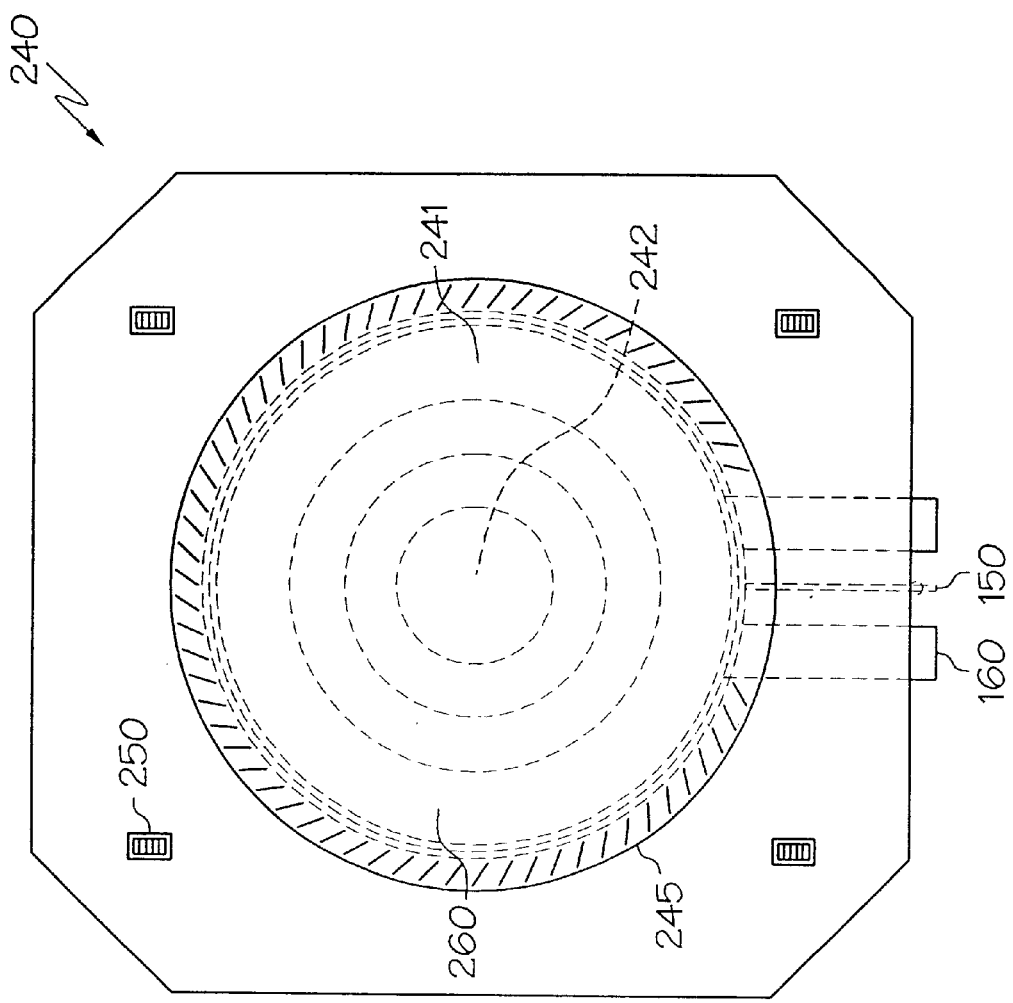
FIG. 5 is a plan view of the wafer cassette's wafer chuck.

FIG. 5 depicts the cooperative placement of the electric wafer heater 260, the vacuum interconnect 150, and the wafer heater interconnect 160 in the wafer chuck 240. Wafer chuck 240 includes an evacuation chamber 242 adjacently below apertured test platform surface 241. A vacuum interconnect 150 establishes vacuum communication between evacuation chamber 242 and an externally-supplied vacuum line. As can be seen in the figure, evacuation chamber 242 with electric wafer heater 260 is substantially axially aligned with, and disposed at one axial end of, the wafer test chamber. The electric heater interconnect 160 provides current to the electric wafer heater 260, which fits into evacuation chamber 242 of wafer chuck 240 such that they do not appreciably extend beyond the heightwise dimension of wafer chuck 240. Rough alignment fixtures 250 are disposed on a surface of wafer chuck 240 to facilitate connection between the plate and wafer test area 230. Seal 290 (shown in FIG. 1) is used for providing a pressure barrier between evacuation chamber 242 and an ambient environment. Seal 290 is typically made of rubber or related elastic material the choice of which is governed by the expected temperature regime. Test platform surface 241 of wafer chuck 240 is also substantially axially aligned with wafer test area 230 and wafer test interconnect and temperature and probes 285, 275 of wafer interconnect assembly 270.

Figure 6:
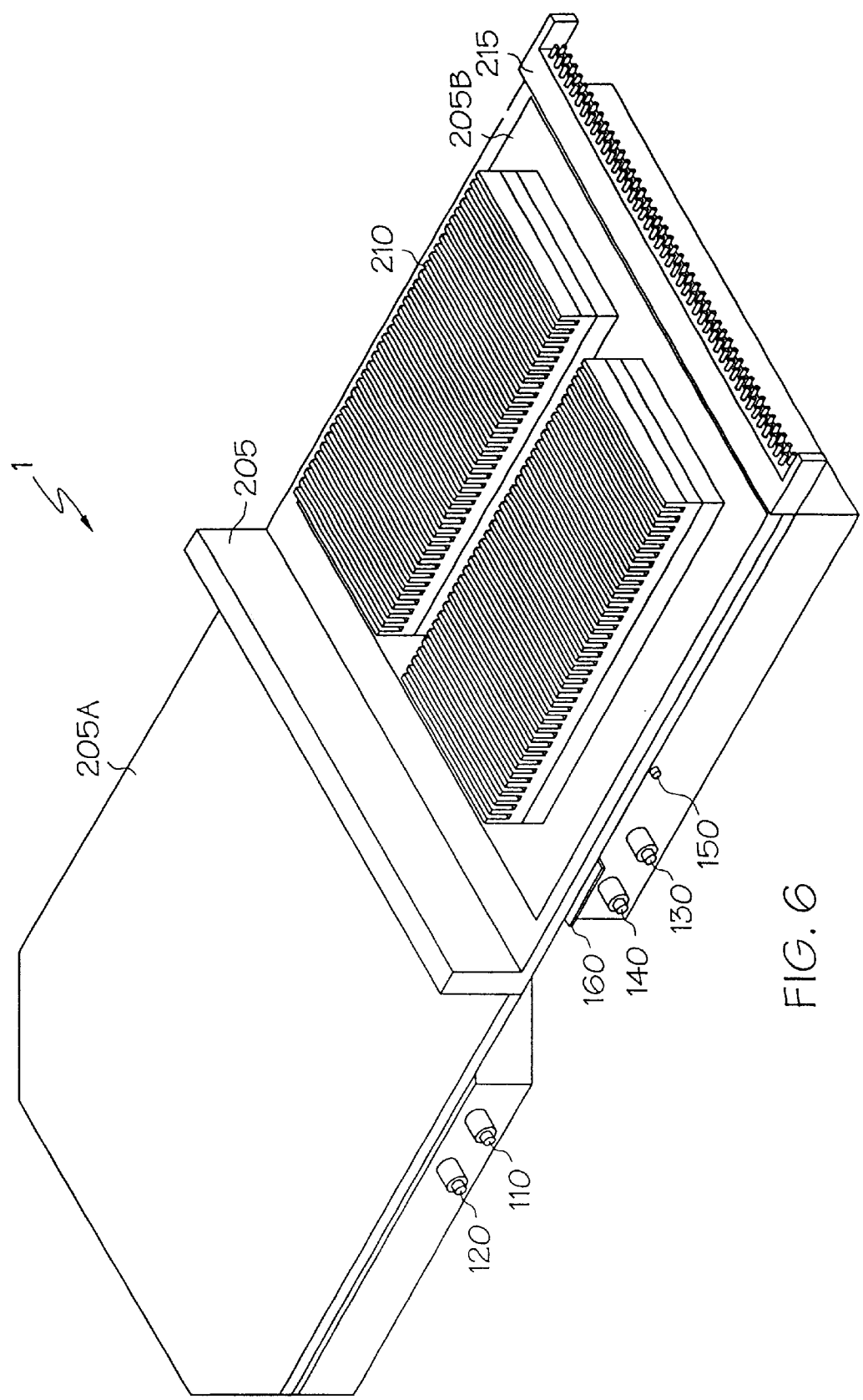
FIG. 6 is an isometric view of the fully assembled wafer cassette burn-in device of the present invention.

In FIG. 6, a complete wafer burn-in test assembly 1, comprising a cassette 20 stacked on top of, and connected to, base 10, is shown. The substantially axial alignment underneath the respective halves of the platform 205A, covering the wafer side, and 205B, supporting the wafer test electronics 205B, can be seen, as can the fluid inlet and outlet connections 110, 120, 130 and 140 of the ancillary thermal circuits. Wafer heater interconnect 160 and vacuum interconnect 150 are shown protruding from a sidewall of first support compartment 100.

While the embodiments and systems discussed herein have been directed to a dual-zone thermal control base, a removable wafer cassette with integral wafer test electronics, it is within the scope of the present invention to adapt the features of the present responsive to varying user demands. For example, the numerous elements of the wafer cassette portion could be consolidated into a single, unified structure, rather than in its present, sandwich construction configuration. Similarly, the described and claimed attributes of the present wafer test device could be further integrated into a larger, self-contained test and repair apparatus such that test, repair, marking, inspection and packaging could be encompassed in a single machine. Thus, having described the present invention in detail and by reference to the embodiments thereof, it will be apparent that modifications and variations are possible without departing from the scope of the invention in the following claims.

What is claimed is:

1. A wafer cassette support comprising:
   a multicompartment wafer base section including a first support compartment and a second support compartment wherein each compartment of said multicompartment wafer base section is laterally spaced substantially adjacent one another such that a common boundary between said laterally spaced compartments is defined by an insulative medium to provide to provide thermal isolation between said compartments; and
   a plurality of thermal circuits, each said circuit including a fluid inlet and a fluid outlet, wherein a first thermal circuit of said plurality of thermal circuits is disposed within said first support compartment of said multicompartment wafer base section, and a second thermal circuit of said plurality of thermal circuits is disposed within said second support compartment of said multicompartment wafer base section, with outward extending externally accessible ends of each of said inlet and outlet to enable attachment of external thermal control lines thereto.

2. A wafer cassette support according to claim 1, further comprising a heater interconnect disposed substantially within said second support compartment and defining an electric access port for an electric wafer heater.

3. A wafer cassette support according to claim 2, wherein the end of said heater interconnect opposite the end defining said access port is adapted to be in electrical communication with said electric wafer heater.

4. A wafer cassette support according to claim 3, further comprising a vacuum interconnect disposed within said second support compartment, and in fluid communication with said first support compartment.

5. A wafer cassette support according to claim 4, wherein each of said plurality of thermal circuits is configured to facilitate independent temperature control within its respective support compartment.

6. A wafer cassette support according to claim 5, wherein said second thermal circuit is adapted to be in thermal communication with a removable wafer test electronics structure.

7. A wafer cassette support according to claim 6, wherein said first thermal circuit is adapted to be in thermal communication with a semiconductor wafer.

8. A wafer cassette support according to claim 1, wherein the heightwise dimension of said second support compartment is larger than said first support compartment by an amount substantially equal to the thickness of a wafer chuck to which said base is designed to be attached.

9. A wafer cassette support according to claim 1, wherein said base section is attached to a semiconductor wafer test apparatus in a fixed, stationary relationship.

10. A wafer cassette support comprising:
   a base which includes:
      a first support compartment;
      a second support compartment substantially adjacently spaced with said first support compartment with an insulative medium between adjacent sides of said support compartments for thermal isolation, wherein the heightwise dimension of said second support compartment is larger than said first support compartment by an amount substantially equal to the thickness of a wafer chuck to which said base is designed to be attached;
   a plurality of thermal circuits, each said circuit including:
      a fluid inlet; and
      a fluid outlet,
      wherein a first thermal circuit of said plurality of thermal circuits is disposed within said first support compartment, and a second thermal circuit of said plurality of thermal circuits is disposed within said second support compartment, wherein said plurality of thermal circuits each traverse their respective said support compartments in a planar fashion, with outward extending externally accessible ends of each of said inlet and outlet to enable attachment of external thermal control lines thereto, wherein each of said plurality of thermal circuits is configured to facilitate independent temperature control within its respective support compartment, wherein said second thermal circuit is adapted to be in thermal communication with a removable wafer test electronics structure and said first thermal circuit is adapted to be in thermal communication with a semiconductor wafer;

a heater interconnect disposed substantially within said second support compartment and defining an electric access for an electric wafer heater, with the end of said heater interconnect opposite the end defining said access is adapted to be in electrical communication with an electric wafer heater; and a vacuum interconnect disposed within said second support compartment, and in fluid communication with said first support compartment.

11. A wafer cassette comprising:

a wafer board, said board including:
  a platform defining a main cassette support structure;
  wafer test electronics adapted to be disposed on at least a portion of said platform;
  a test interface connector mounted on said platform, said test interface connector configured to interface said wafer test electronics and an external electrical supply;
  a wafer interconnect assembly connected to at least said platform and in electrical communication with said wafer test electronics, said wafer interconnect assembly adapted to be in electrical communication with a semiconductor wafer;
  a wafer test area connected to said wafer interconnect assembly; and
  a flex film interconnect defining electrical communication between said wafer test electronics and said wafer interconnect assembly, said flex film interconnect connected to at least said wafer test area; and a wafer chuck, said wafer chuck including:
  a test platform surface upon which a wafer can fit; and
  at least one rough alignment fixture disposed on a surface of said wafer chuck to facilitate connection between said wafer chuck and said wafer test area.

12. A wafer cassette according to claim 11, further comprising wafer test interconnect probes disposed on a surface of said wafer interconnect assembly and adjacent said wafer test area.

13. A wafer cassette according to claim 12, wherein said wafer test area further includes an aperture in the surface thereof to permit said wafer test interconnect probes to come in contact with said semiconductor wafer.

14. A wafer cassette according to claim 13, wherein said wafer test electronics are adapted to be substantially axially aligned with an external thermal circuit to remove excess heat from said wafer test electronics.

15. A wafer cassette according to claim 14, wherein said wafer chuck test platform surface is substantially axially aligned with said wafer test area disposed on said wafer interconnect assembly, said wafer test interconnect probes disposed in said wafer interconnect assembly, and a surface of said platform to define a wafer test chamber.

16. A wafer cassette according to claim 16, wherein said wafer chuck further comprises:

an evacuation chamber adjacent said test platform surface;

a vacuum interconnect in vacuum communication between said evacuation chamber and an externally-supplied vacuum line; and a seal for providing a pressure barrier between said evacuation chamber and an ambient environment.

17. A wafer cassette according to claim 16, wherein said wafer chuck evacuation chamber and an electric wafer heater are substantially axially aligned with, and disposed at one axial end of, said wafer test chamber.

18. A wafer cassette according to claim 16, wherein said wafer chuck further comprises an electric wafer heater disposed in said evacuation chamber, said electric wafer heater adapted to be connected to an externally-supplied heater interconnect.

19. A wafer cassette comprising:

a wafer board, said board including:
  a platform defining a main cassette support structure;
  wafer test electronics adapted to be disposed on at least a portion of said platform, and adapted to be substantially axially aligned with an external thermal circuit to remove excess heat from said wafer test electronics;
  a test interface connector disposed on said platform;
  a wafer interconnect assembly connected to at least said platform, said wafer interconnect assembly including wafer test interconnect probes disposed on a surface thereof;
  a wafer test area with an aperture in the surface thereof to permit said wafer test interconnect probes to come in contact with a semiconductor wafer connected to said wafer interconnect assembly, with said test area adjacent said wafer test interconnect probes on said wafer interconnect assembly; and
  a flex film interconnect defining electrical communication between said wafer test interconnect probes and said wafer test electronics, said flex film interconnect connected to at least said wafer test area; and a wafer chuck, said wafer chuck including:
  a test platform surface upon a wafer can fit is disposed on said wafer interconnect assembly, and is substantially axially aligned with said wafer test area and said wafer test interconnect probes disposed in said wafer interconnect assembly, and a surface of said platform to define a wafer test chamber;
  an evacuation chamber adjacent said test platform surface adapted to establish vacuum communication with an externally-supplied vacuum interconnect line;
  an electric wafer heater disposed in said evacuation chamber, said electric wafer heater adapted to be connected to an externally-supplied heater interconnect, wherein said wafer chuck evacuation chamber with electric wafer heater is substantially axially aligned with, and disposed at one axial end of, said wafer test chamber;
  a seal for providing a pressure barrier between said evacuation chamber and an ambient environment; and
  at least one rough alignment fixture disposed on a surface of said wafer chuck to facilitate connection between said wafer chuck and said wafer test area;

wherein said platform comprises two substantially equal-sized halves, with the first half defining a cover axially aligned with said wafer interconnect assembly, said wafer test area and said wafer chuck, and a second half defining said portion upon which said wafer test electronics are disposed.

20. A method of testing a semiconductor wafer, comprising:
- providing a semiconductor wafer test base comprising a plurality of thermal circuits;
- securing at least one semiconductor wafer to a test platform surface in order to prevent wafer migration during wafer testing;
- placing a wafer heater in thermal communication with said semiconductor wafer;
- assembling a wafer cassette, said cassette made from the steps of:
  - providing a platform as a main cassette support structure;
  - placing wafer test electronics on said platform;
  - placing wafer interconnect assembly on said platform;
  - establishing electrical connection between said wafer test electronics and said wafer interconnect assembly; and
  - aligning a wafer test area with said wafer interconnect assembly;
- placing a wafer test base in operative contact with said cassette such that said wafer cassette and said wafer test base define a stackably arranged test assembly;
- heating said semiconductor wafer to an elevated temperature with said wafer heater;
- controlling a thermal environment within said stackably arranged test assembly with said plurality of thermal circuits; and
- applying test signals to said semiconductor wafer.

21. A method of testing a semiconductor wafer according to claim 20, further comprising wafer test interconnect probes disposed on a surface of said wafer interconnect assembly and adjacent said wafer test area.

22. A method of testing a semiconductor wafer according to claim 21, wherein said step of securing to prevent wafer migration during test includes:
- circumferentially mounting a seal around said wafer; and
- creating a vacuum on said semiconductor wafer.

23. A method of testing a semiconductor wafer according to claim 22, wherein said thermal circuit controls the thermal environment of said stackably arranged test assembly by:
- controlling said elevated temperature of said semiconductor wafer with a first one of said plurality of said thermal circuits; and
- cooling said wafer test electronics with a second one of said plurality of said thermal circuits.

24. A method of testing a semiconductor wafer according to claim 23, wherein a flex film interface is used to establish said electrical connection between said wafer test electronics and said wafer test interconnect probes.

25. A method of testing a semiconductor wafer, comprising:
- providing a semiconductor wafer test base comprising a plurality of thermal circuits;
- securing at least one semiconductor wafer to a test platform surface in order to prevent wafer migration during wafer testing by:
  - circumferentially mounting a seal around said wafer; and
  - creating a vacuum on said semiconductor wafer;
- placing a wafer heater in thermal communication with said semiconductor wafer;
- assembling a wafer cassette, said cassette made from the steps of:
  - providing a platform as a main cassette support structure;
  - placing wafer test electronics on said platform;
  - placing wafer test interconnect probes on said platform;
  - establishing electrical connection with a flex film interface between said wafer test electronics and said wafer test interconnect probes; and
  - aligning a wafer test assembly with said wafer test interconnect probes;
- placing a wafer test base in operative contact with said cassette such that said wafer cassette and said wafer test base define a stackably arranged test assembly;
- heating said semiconductor wafer to an elevated temperature with said wafer heater;
- controlling said elevated temperature of said semiconductor wafer with a first one of said plurality of said thermal circuits;
- cooling said wafer test electronics with a second one of said plurality of said thermal circuits;
- applying test signals to said semiconductor wafer;
- acquiring results from said applied test signals; and
- determining from said results which regions within said wafer are defective.

26. A method of testing a semiconductor wafer, comprising:
- providing a semiconductor wafer test base comprising a plurality of support compartments, each of said support compartments having disposed therein one or more thermal circuits;
- providing at least one semiconductor wafer on a test platform surface;
- placing an electric wafer in thermal communication with said semiconductor wafer;
- placing a vacuum interconnect in operative proximity to said electric wafer heater;
- circumferentially mounting a pressure-isolating seal around said wafer, defining a wafer fixture such that an upper surface of said wafer defines an upper surface of said wafer fixture;
- assembling a wafer cassette comprising an upper and lower surface, said cassette made from the steps of:
  - providing a platform as a main cassette support structure comprising an upper and lower surface;
  - placing wafer test electronics on said upper surface of said platform;
  - placing an upper surface of a wafer interconnect assembly with wafer test interconnect probes in an axially aligned stackable connection with said lower surface of said platform;
  - connecting a conductor-carrying flex film interface such that electrical communication is established between said wafer test electronics and said wafer test interconnect probes; and
  - placing a surface of a wafer test assembly comprising an aperture therethrough in an axially aligned stackable connection with a surface of said wafer interconnect assembly such that said wafer test interconnect probes and said aperture in said wafer test assembly define a portion of a wafer test chamber;
- placing said surface of said wafer fixture in operative contact with said cassette such that said portion of said wafer test chamber of said cassette is in an axially stackable arrangement therewith to define a stackably arranged test assembly;
- creating a vacuum on said lower surface of said semiconductor wafer via said vacuum interconnect;

heating said semiconductor wafer to an elevated temperature with said electric wafer heater;
controlling said elevated temperature of said semiconductor wafer with a first one of said plurality of said thermal circuits;
cooling said wafer test electronics with a second one of said plurality of said thermal circuits;
applying test signals through said electrical test network to said semiconductor wafer;
acquiring results from said applied test signals; and
determining from said results which regions within said wafer are defective.

27. A wafer cassette assembly for use in convection or ambient environments, comprising:
    a stationary base portion which includes:
        a first support compartment;
        a second support compartment substantially adjacently spaced with said first support compartment; and
        a plurality of thermal circuits, each said circuit including a fluid inlet and a fluid outlet, wherein a first thermal circuit of said plurality of thermal circuits is disposed within said first support compartment, and a second thermal circuit of said plurality of thermal circuits is disposed within said second support compartment, with outward extending externally accessible ends of each of said inlet and outlet to enable attachment of external thermal control lines thereto; and
    a removable wafer cassette portion which includes:
        a wafer board, said board including:
            a platform defining a main cassette support structure;
            wafer test electronics adapted to be disposed on at least a portion of said platform;
            a test interface connector disposed on said platform;
            a wafer interconnect assembly connected to at least said platform, said wafer interconnect assembly including wafer test interconnect probes disposed on a surface thereof;
            a wafer test area connected to said wafer interconnect assembly, said test area adjacent said wafer test interconnect probes on said wafer interconnect assembly, and
            a flex film interconnect defining electrical communication between said wafer test interconnect probes and said wafer test electronics, said flex film interconnect connected to at least said wafer test area; and
        a wafer chuck, said wafer chuck including:
            a test platform surface upon which a wafer can fit; and
            at least one rough alignment fixture disposed on a surface of said wafer chuck to facilitate connection between said wafer chuck and said wafer test area.

28. A wafer cassette assembly according to claim 27, further comprising a heater interconnect disposed substantially within said second support compartment and defining an electric access port for an electric wafer heater.

29. A wafer cassette assembly according to claim 28, further comprising a vacuum interconnect disposed within said second support compartment, and in fluid communication with said first support compartment.

30. A wafer assembly according to claim 29, wherein each of said plurality of thermal circuits is configured to facilitate independent temperature control within its respective support compartment.

31. A wafer cassette assembly according to claim 30, wherein the heightwise dimension of said second support compartment is larger than said first support compartment by an amount substantially equal to the thickness of said wafer chuck.

32. A wafer cassette assembly according to claim 31, wherein said wafer chuck further comprises:
    an evacuation chamber adjacent said test platform surface;
    a vacuum tube in vacuum communication between said evacuation chamber and a vacuum line; and
    a seal for providing a pressure barrier between said evacuation chamber and an ambient environment.

33. A wafer cassette assembly according to claim 32, wherein each of said plurality of thermal circuits traverse their respective said support compartments in a planar fashion to maximize thermal communication with an upper surface of each of said support compartments.

34. A thermal control system for burn-in testing of semiconductor devices, comprising:
    a multicompartment wafer base section, wherein each compartment of said section is laterally spaced substantially adjacent one another, and a common boundary between adjacent sides of said laterally spaced compartments is defined by respective sides thereof and an insulative medium to provide thermal isolation between said compartments;
    a first thermal control section disposed within at least one of said compartments, comprising:
        an electric wafer heater;
        a heater interconnect in electrical communication with said electric wafer heater; and
        a test platform surface in substantially axial alignment with said electric wafer heater;
    a second thermal control section comprising a plurality of individual thermal circuits, said second thermal control section comprising:
        a first thermal circuit disposed within a first compartment of said multicompartment wafer base section; and
        a second thermal circuit disposed within a second compartment of said multicompartment wafer base section, wherein each of said first and second thermal circuits include a fluid inlet connector and a fluid outlet connector with outward extending externally accessible ends of each of said inlet and outlet; and
    a vacuum section comprising:
        an evacuation chamber in substantially axial alignment with said electric wafer heater and disposed within at least one of said compartments; and
        a vacuum interconnect in vacuum communication with said evacuation chamber;
    wherein said first thermal control section, in conjunction with the simultaneous operation of said second thermal control section, is capable of maintaining strict, precise temperature control for a semiconductor wafer mounted to a removable wafer cassette fixture mounted on said base section and held in place by said vacuum section.

35. A thermal control system according to claim 34, further comprising a removable wafer cassette section, which includes:
    a wafer board, said board including:
        a platform defining a main cassette support structure;
        wafer test electronics adapted to be disposed on at least a portion of said platform;

a test interface connector disposed on said platform;

a wafer interconnect assembly connected to at least said platform, said wafer interconnect assembly including wafer test interconnect probes and temperature probes disposed on a surface thereof;

a wafer test area connected to said wafer interconnect assembly, said test area adjacent said wafer test interconnect probes and said temperature probes on said wafer interconnect assembly, and a flex film interconnect defining electrical communication between said wafer test interconnect probes, said temperature probes and said wafer test electronics, said flex film interconnect connected to at least said wafer test area; and a wafer chuck, said wafer chuck including:

a test platform surface upon which a wafer can fit; and at least one rough alignment fixture disposed on a surface of said wafer chuck to facilitate connection between said wafer chuck and said wafer test area;

such that, said wafer cassette section attached to said multicompartment wafer base section comprises a wafer test fixture for evaluating the electrical response of a wafer under elevated temperature conditions created by said first and second thermal control sections.

36. A method of heating a semiconductor device for burn-in testing, comprising:

providing a multicompartment semiconductor device test base comprising a plurality of support compartments, each of said support compartments including a thermal circuit disposed therein and laterally spaced substantially adjacent one another with a common boundary between adjacent sides thereof and with an insulative medium disposed therebetween to provide thermal isolation between said compartments;

securing at least one semiconductor device to a test platform surface in order to prevent device migration during device testing;

placing a heater in thermal communication with said semiconductor device;

connecting said test platform surface with said multicompartment semiconductor device test base such that a first one of said thermal circuits is in thermal communication with a surface of said semiconductor device;

heating said semiconductor device to an elevated temperature with said heater; and controlling said elevated temperature of said semiconductor device with said first one of said thermal circuits and said heater.

37. A method of heating a semiconductor device according to claim 36, wherein securing step is accomplished by:

placing a vacuum interconnect line adjacent said heater, where said vacuum interconnect line is in vacuum communication with an externally supplied evacuation source;

mounting a seal around said device; and creating a vacuum on said semiconductor device by operating said evacuation source such that said device and said seal form an airtight connection with said test platform surface.

38. A method of heating a semiconductor wafer, comprising:

providing a multicompartment semiconductor device test base comprising a plurality of support compartments, each of said support compartments including a thermal circuit disposed therein and laterally spaced substantially adjacent one another with a common boundary between adjacent sides thereof and with an insulative medium disposed therebetween to provide thermal isolation between said compartments;

mounting a seal on a test platform surface;

mounting a semiconductor wafer on a test platform surface;

placing a wafer heater in thermal communication with at least one side of said semiconductor wafer;

connecting said test platform surface with said multicompartment semiconductor wafer test base such that a first one of said thermal circuits is in thermal communication with a surface of said semiconductor wafer;

securing said semiconductor wafer and said seal to said test platform surface in order to prevent wafer migration during wafer testing, wherein securing is accomplished by:

placing a vacuum interconnect line adjacent said heater, where said vacuum interconnect line is in vacuum communication with an externally supplied evacuation source; and creating a vacuum on said semiconductor wafer and said seal by operating said evacuation source such that said wafer and said seal form an airtight connection with said test platform surface;

heating said semiconductor wafer to an elevated temperature with said wafer heater; and controlling said elevated temperature of said semiconductor wafer with said first one of said thermal circuits and said heater.

\* \* \* \* \*

UNITED STATES PATENT AND TRADEMARK OFFICE
CERTIFICATE OF CORRECTION

PATENT NO.     : 6,441,606 B1
DATED          : July 8, 2002
INVENTOR(S)    : Caldwell et al.

It is certified that error appears in the above-identified patent and that said Letters Patent is hereby corrected as shown below:

Column 2,
Line 41, reads as "modem electronic circuits", should read -- modern electronic circuits --.

Column 8,
Line 2, reads as "to provide to provide", should read -- to provide --.

Column 9,
Line 64, reads as "claim 16", should read -- claim 12 --.

Column 14,
Line 19, reads as "control system for", should read -- control section for --.
Line 60, reads as "section", should read -- system --.

Signed and Sealed this

Eleventh Day of February, 2003

JAMES E. ROGAN
*Director of the United States Patent and Trademark Office*